(12) United States Patent
Larsson (10) Patent No.: US 9,967,440 B2
(45) Date of Patent: May 8, 2018

(54) HOUSING AND A CAMERA COMPRISING A HOUSING

(71) Applicant: Axis AB, Lund (SE)

(72) Inventor: Stefan Larsson, Lund (SE)

(73) Assignee: Axis AB, Lund (SE)

( * ) Notice: Subject to any disclaimer, the term of this patent is extended or adjusted under 35 U.S.C. 154(b) by 30 days.

(21) Appl. No.: 15/163,872

(22) Filed: May 25, 2016

(65) Prior Publication Data

US 2016/0352981 A1    Dec. 1, 2016

(30) Foreign Application Priority Data

May 27, 2015   (EP) .................................... 15169374

(51) Int. Cl.
| | | |
|---|---|---|
| *H04N 5/225* | (2006.01) | |
| *G03B 17/02* | (2006.01) | |
| *H05K 5/02* | (2006.01) | |

(52) U.S. Cl.
CPC ........... *H04N 5/2252* (2013.01); *G03B 17/02* (2013.01); *H04N 5/2253* (2013.01); *H04N 5/2254* (2013.01); *H05K 5/0247* (2013.01)

(58) Field of Classification Search
CPC .. H04N 5/2252; H04N 5/2253; H04N 5/2254; H05K 5/0247; G03B 17/02
See application file for complete search history.

(56) References Cited

U.S. PATENT DOCUMENTS

| | | | |
|---|---|---|---|
| 4,108,527 A | 8/1978 | Douty et al. | |
| 4,138,185 A * | 2/1979 | Jaconette, Jr. ..... | H01R 13/5825 174/156 |
| 5,010,876 A | 4/1991 | Henley et al. | |
| 5,076,656 A * | 12/1991 | Briggs ................. | G02B 6/3807 385/60 |
| 6,464,530 B1 | 10/2002 | Smith et al. | |
| 7,563,040 B2 * | 7/2009 | Tsai ..................... | H04N 5/2251 348/374 |
| 7,703,731 B1 * | 4/2010 | Kuo ..................... | H04N 5/2252 248/126 |
| 2007/0253703 A1 * | 11/2007 | Tsai ..................... | H04N 5/2251 396/429 |
| 2010/0097519 A1 | 4/2010 | Byrne et al. | |
| 2014/0221749 A1 * | 8/2014 | Grant ................. | A61B 1/00183 600/112 |
| 2016/0028188 A1 * | 1/2016 | Dunwoody ........ | H01R 13/6581 439/607.55 |
| 2017/0078583 A1 * | 3/2017 | Haggerty ............ | H04N 5/2252 |

FOREIGN PATENT DOCUMENTS

DE    10 2011 052 199 B3    9/2012

OTHER PUBLICATIONS

EP 15 16 9374.4 European Search Report (dated Nov. 19, 2015).

* cited by examiner

*Primary Examiner* — Jason A Flohre
(74) *Attorney, Agent, or Firm* — Volpe and Koenig, P.C.

(57) ABSTRACT

A housing for enclosing an electric circuitry and for providing a cable strain relief function to a cable extending from the electric circuitry and out of the housing and a camera comprising such a housing is disclosed. The housing comprises a first part with a first recess and a second part with a second recess, wherein the first and second recesses each has a first sidewall portion, a bottom portion and a second sidewall portion, the first and second sidewall portions of the first recess being arranged offset to each other in a cable exit direction.

14 Claims, 7 Drawing Sheets

HOUSING AND A CAMERA COMPRISING A HOUSING

FIELD OF INVENTION

A housing adapted to provide a cable relief function and a camera comprising such a housing is disclosed.

BACKGROUND

A digital camera typically comprises an optical system, an image sensor, electric circuitry connected to the image sensor and a body member housing or supporting the optical system, the image sensor and the electric circuitry. When the digital camera is a so-called handheld camera, the housing typically completely houses the image sensor and the electric circuitry and any connections to other kinds of equipment, such as a battery charger or a personal computer, are accomplished through communication ports in the housing into which ports a connector of a cable is inserted. Such connection may e.g. be according to USB standard.

In other cases, such as when designing cameras for installation in a monitoring system or the like, the overall design criteria, such as a general desire to minimize the size of the camera, often results in that the camera includes a short cable connected to and extending from the electric circuitry and that any connection to other kinds of equipment, such as a computer or a network connection, are accomplished by a connection to this cable. It is often desired that the connection between the electric circuitry and the cable is made as small as possible. The connection may be detachable or non-detachable. The other end of the cable, the end being remote from the electric circuitry, may be design with a more sturdy connection. This latter connection may e.g. be according to USB standard or a standard 8P8C connection (often referred to as RJ45 for telecommunication or Ethernet network communication).

One problem associated with this latter design is that when the user performs any action involving the cable, such as when connecting or disconnecting any further equipment, there is a risk that the user accidentally exerts a force, such as a pulling force, on the cable with such a magnitude that the connection between the cable and the electric circuitry is damaged.

In U.S. Pat. No. 6,464,530 there has been identified a problem related to the fact that computer servers frequently have many cables exiting the computer enclosure and that each of the cables must be clamped at the rear of the server. The document discloses a cable strain relief where a cable is trained in an elaborate meandering pattern underneath a plurality of hooks. However, the disclosed design is bulky and complex to install.

SUMMARY

It is an object of the disclosure to provide a cable strain relief which may be given a compact design and which is easy to use. Further advantages are described below.

The object of the disclosure is achieved by the provision of a housing for enclosing an electric circuitry and for providing a cable strain relief function to a cable extending from the electric circuitry and out of said housing.

The housing comprises a first part and a second part, the first and second parts being separate parts adapted to be connected to each other in a connected state thereby forming said housing. The housing has an opening, formed in an interface between the first part and the second part, for allowing the cable to extend out of the housing along a cable exit direction and for securing the cable against movement relative to the housing along the cable exit direction. The opening is formed by a first recess in a wall portion of the first part and a second recess in a wall portion of the second part, the first and second recesses both being open towards the interface and extending through the respective wall portion in the cable exit direction.

The first recess has a first sidewall portion, a bottom portion and a second sidewall portion, the first and second sidewall portions of the first recess being arranged offset to each other in the cable exit direction, The second recess has a first sidewall portion, a bottom portion and a second sidewall portion, the first and second sidewall portions of the second recess being arranged offset to each other in the cable exit direction.

When the first and second parts are in the connected state, the first sidewall portion of the first recess is arranged opposite, in a direction perpendicular to the cable exit direction, the first sidewall portion of the second recess and the second sidewall portion of the first recess is arranged opposite, in a direction perpendicular to the cable exit direction, the second sidewall portion of the second recess.

The first and second parts are adapted to be connected to each other and be held together forming said housing. They may be held together by a separate member but in the preferred embodiment the parts are provided with interacting locking members holding the two parts together.

The housing is useful for use in different set-ups in respect of how the electric circuitry is supported and how the electric circuitry is enclosed. The first and the second part of the housing are designed to together provide a cable strain relief function. The first and/or the second part of the housing may enclose all or some of the electric circuitry. The first and/or the second part of the housing may support all or some of the electric circuitry. The housing may comprise one or more further members to which the first and/or the second part of the housing may be attachable. The further member(s) may support all of the electric circuitry. The further member(s) may be supporting some of the electric circuitry and the first and/or second part may be supporting some of the electric circuitry. The further member(s) may be enclosing all of the electric circuitry. The further member(s) may be enclosing some of the electric circuitry and the first and/or second part may be enclosing some of the electric circuitry.

The cable strain function of the housing is useful when the electric circuitry is directly or indirectly fixedly arranged relative the housing.

With the design with an opening allowing the cable to extend out of the housing along a cable exit direction and securing the cable against movement relative to the housing along the cable exit direction it is prevented (or at least the risk is reduced) that pulling forces on the cable relative the housing is transferred into the interface between the electric circuitry and the cable or to the electric circuitry.

With the first and second sidewalls of respective recess being offset to each other such that the first sidewalls of the two recesses and the second sidewalls of the recesses will be arranged opposite each other in the connected state it is possible to provide a cable strain function which is strong compared to the force needed to assemble the housing.

With the first and second sidewalls of respective recess being offset to each other such that the first sidewalls of the two recesses and the second sidewalls of the recesses will be arranged opposite each other in the connected state the opening will along the cable exit direction have a first portion formed by the first sidewall portions of the first and second recesses and a second portion formed by the second sidewall portions of the first and second recesses.

In some cases it is preferred that the opening also provides a sealing function. In such a case the recesses are shaped such that they will abut the cable with a certain sealing force all around the cable. With the inventive design it is possible to provide such a sealing force and to provide a desired cable strain relief function without the cable strain relief function giving rise to forces tending to separate the first and second parts.

Preferred embodiments will appear from the description and from the dependent claims.

The housing may be designed such that, when the first and second parts are in the connected state, a shortest distance between the first sidewalls and/or between the second sidewalls is dimensioned to be smaller than a size of the cable located between the first and/or second sidewalls. Thereby the sidewalls will clamp the cable between them and provide a cable strain relief function.

The first sidewalls of the first and second recesses or the second sidewalls of the first and second recesses may have, along a direction extending from the respective bottom wall portion towards the bottom wall portion of the opposing recess, an extension past a mid-point of the opening. If the first or the second sidewalls have such an extension it is possible to achieve a cable strain relief function which is strong compared to the force needed to assemble the housing.

The two sidewalls (first and second sidewalls) of the first recess or the two sidewalls (first and second sidewalls) of the second recess have, along a direction extending from the respective bottom wall portion towards the bottom wall portion of the opposing recess, an extension past a mid-point of the opening. If the two sidewalls of one of the recesses have such an extension installation is facilitated. The cable may be inserted in the thus formed recess and may be held in place relative to one of the parts when the user puts the parts together.

Preferably both the first and second sidewalls of both the first and second recess have, along a direction extending from the respective bottom wall portion towards the bottom wall portion of the opposing recess, an extension past a mid-point of the opening.

With such a design the cable may be inserted in any of the parts during the operation of putting the parts together and it is possible to achieve a strong cable strain relief function originating from two sets of opposing sidewalls.

The offset of the sidewalls of the first part may be equal to the offset of the sidewalls of the second part. With such a design the sidewalls will end up directly opposite each other thereby being able to provide a strong cable strain relief function.

The housing may be designed such that, when the first and second parts are in the connected state, a shortest distance between the first sidewalls and/or between the second sidewalls is smaller than a maximum distance between the bottom wall portions of the first and second recesses. With such a design it is possible to provide a strong cable strain relief function without any unwanted separation force from the cable forcing the first and second parts from each other.

The housing may be designed such that a shortest distance between the first and second sidewalls of the first and/or second recess is dimensioned to be smaller than a size of the cable located between the first and second sidewalls. This way it is possible to insert the cable between the first and second sidewalls and the cable and the part will have a tendency to stay together during assembly.

The first and second parts may each be provided with a first protrusion and a second protrusion each having, along a direction extending from the respective bottom wall portion towards the bottom wall portion of the opposing recess, an extension past a mid-point of the opening.

The housing may be designed such that a portion of the first sidewall of respective recess is formed by a surface of the first protrusion facing the second protrusion and a portion of the second sidewall of respective recess is formed by a surface of the second protrusion facing the first protrusion.

The first protrusion of the first part may be provided with a first surface adapted face a second surface of the second part and the first protrusion of the second part may be provided with a first surface adapted to face a second surface of the first part. The first surfaces are preferably at least partly located above the mid-point of respective part, and the second surfaces are preferably at least partly located below the mid-point of respective part.

The protrusions of the recesses may interact with each other with the surfaces on portions extending past the mid-point and will thereby support each other and increase the strength of the structure. The surfaces may extend along each other with no contact during assembly of the parts.

The first part may be provided with a first member of a snap-lock and the second part may be provided with a second member of the snap-lock.

The first part may be provided with a first member of a first snap-lock and a second member of a second snap-lock of the same kind as the first snap-lock and the second part may be provided with a second member of the first snap-lock and a first member of the second snap-lock.

The bottom portion of respective recess may be formed of a first portion extending as an extension of the first side wall portion and a second portion extending as an extension of the second side wall portion, wherein the two portions may be offset to each other along the exit direction, wherein respective part also may comprise a ridge formed as a protrusion extending along a direction, extending from the respective bottom wall portion towards the bottom wall portion of the opposing recess, and extending along the exit direction between the two bottom portions.

The first part may be provided with a guiding flange adapted to coextend with and abut an inside wall portion of the second part. The second part may be provided with a guiding flange adapted to coextend with and abut an inside wall portion of the first part.

The first part and the second part may be identical. Such a design facilitates manufacturing since it is possible to produce both parts in the same manner. It is e.g. possible to use the same moulding tool if the parts are made by moulding of a plastic material. It also facilitates assembly since the user need not determine the identity of the first and second part.

According to a second aspect the disclosure relates to a digital camera comprising an optical system, an image sensor, electric circuitry connected to the image sensor, a cable connected to and extending from the electric circuitry, and a body member housing or supporting the optical system, the image sensor and the electric circuitry. The camera comprises a housing of the kind described in this application. Preferred embodiments of the housing are applicable also in respect of the camera. The body member is provided with an attachment portion. The first and second part of the housing are provided with attachment portions adapted to interact with the attachment portion of the body member. The housing is adapted to house a portion of the cable and wherein the sidewalls of the recesses are adapted to hold the cable and provide a cable strain relief function. The body member may be considered an example of a further member of the housing as indicated above. The body member and the first and second part may be supporting and enclosing the electric circuitry in accordance with the different set-ups as discussed above. In one embodiment, the body member supports all of the electric circuitry with the first and second part together enclosing some the electric circuitry supported by the body member.

BRIEF DESCRIPTION OF THE DRAWINGS

A more detailed understanding may be had from the following description, given by way of example in conjunction with the accompanying drawings wherein:

FIG. 2-7 disclose different views of a part of a housing of the camera of FIG. 1. In FIG. 6 two parts are shown separated from each other;

DETAILED DESCRIPTION

In the following detailed description the housing will be described in detail when used as a part of a housing of a camera.

Figure 1:
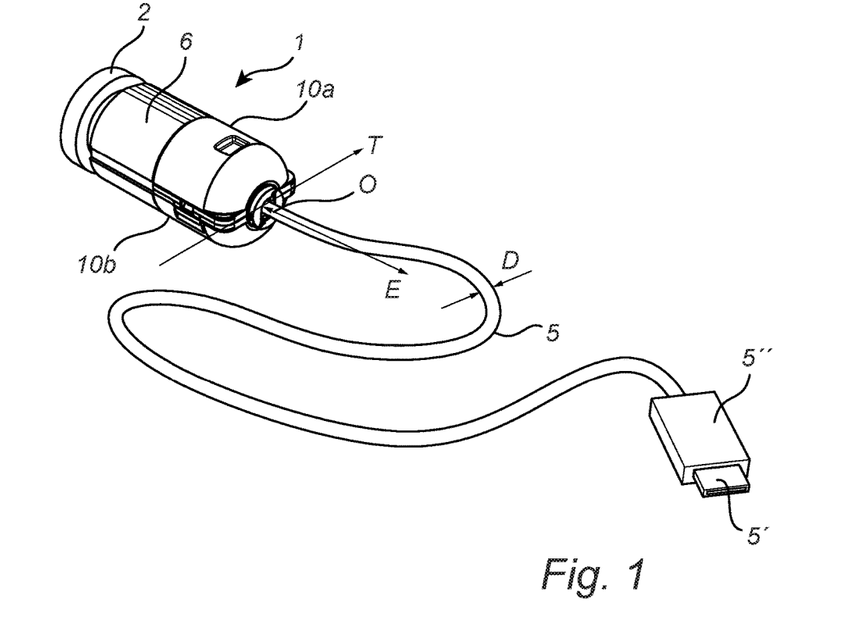
FIG. 1 discloses a camera.

An overall view of the camera 1 in assembled form is shown in FIG. 1. In FIG. 1 there is especially shown a portion of the housing formed of two parts 10a, 10b (see also FIG. 6) and a cable 5 extending out of the housing formed of the two parts 10a, 10b.

The digital camera 1 comprises an optical system or lens system 2 (see FIG. 9), an image sensor 3 (shown in FIG. 10), electric circuitry 4 connected to the image sensor 3, a cable 5 connected to and extending from the electric circuitry 4, and a body member 6 (shown in FIG. 8) supporting and partly housing the optical system 2, the image sensor 3 and the electric circuitry 4.

Figure 6:
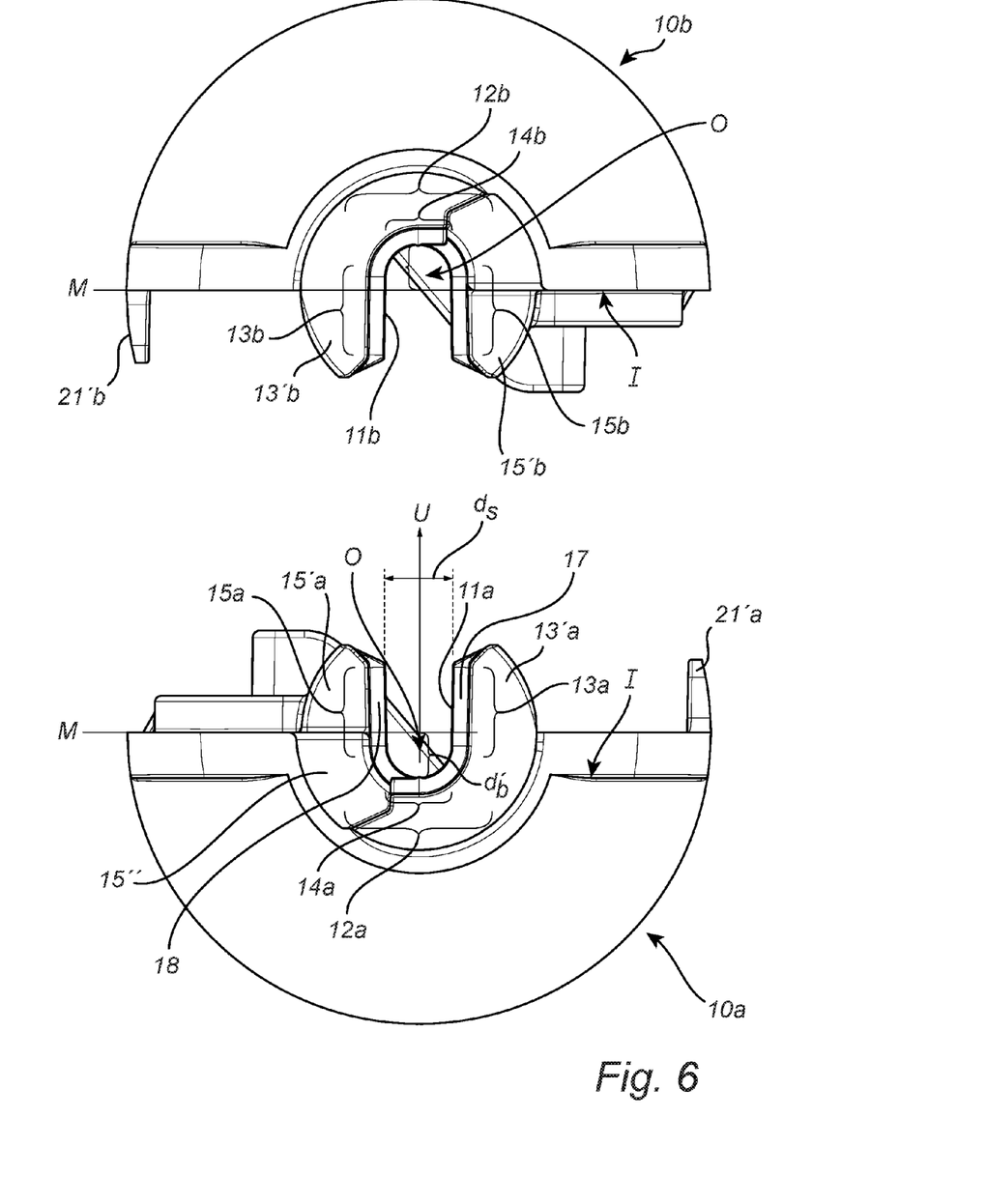

As briefly mentioned, the camera 1 comprises a housing formed of two separate parts 10a, 10b adapted to be connected to each other in a connected state to thereby form the housing (see FIG. 6). In this preferred embodiment the two parts 10a, 10b are identical and the detailed description will for clarity reasons to a large extent only describe the parts 10a, 10b in singular with reference to the part 10. The same principal will be used in respect of the different portions of the different parts 10a, 10b.

Figure 10:
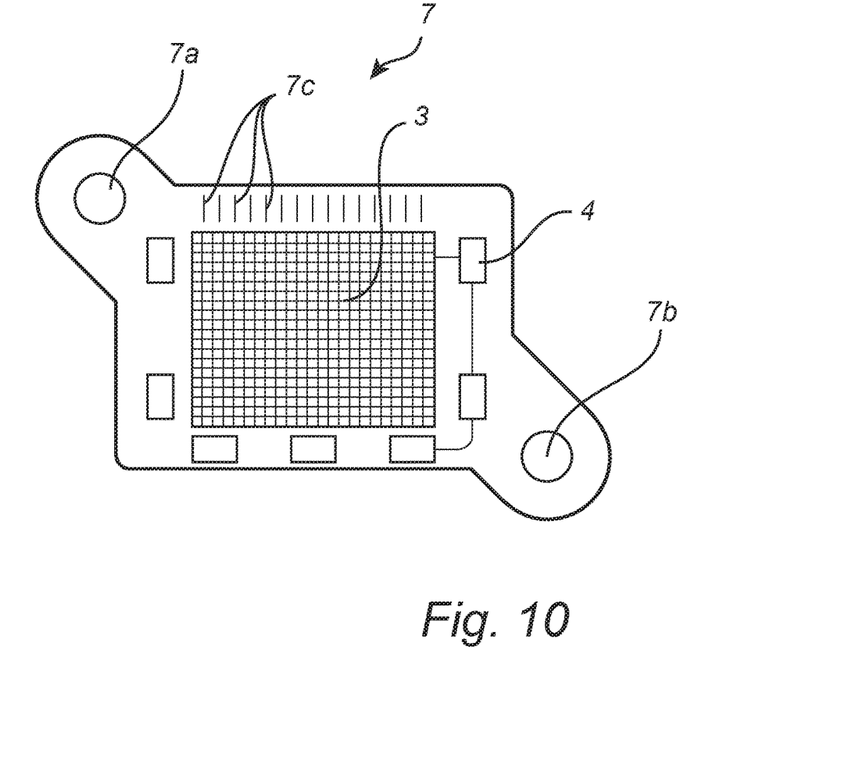
FIG. 10 discloses electric circuitry including an image sensor.

As disclosed in FIG. 10, the image sensor 3 and electric circuitry 4 is arranged on a circuit board 7. The circuit board 7 is adapted to be attached to the body member 6 and be held in place by screws extending through the holes 7a, 7b in the circuit board 7 and threaded into the holes 6a, 6b of the body member 6. The optical system 2 is adapted to be threaded into the body member 6.

Figure 11:
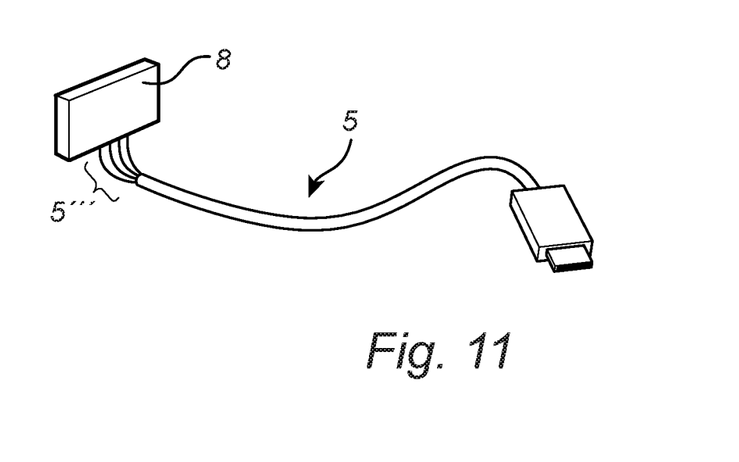
FIG. 11 discloses a cable.

As shown in FIG. 10, the circuit board 7 is provided with coupling pins 7c to which a cable adaptor 8 (shown in FIG. 11) is adapted to be detachably or non detachably connected. The cable adaptor 8 connects the different strands of the cable 5 to the coupling pins 7c.

At the other end of the cable 5, the cable 5 is provided with a standard connector 5' to a computer or network. A micro USB-connector is shown in FIG. 1, but other connectors are contemplated, such as a USB-connector or a standard 8P8C connection (often referred to as RJ45 for telecommunication or Ethernet network communication). Other connectors considered suitable may also be used.

The cable 5 is an electrical cable for transmitting from the electric circuitry 4 an electrical signal representing an image detected by the image sensor 3. The cable is also used for providing electrical power to the electric circuitry 4. The cable may in cross-section have a plurality of electrical wires encased in a casing of an elastic material, preferably an electrically insulating, elastic, polymeric material.

As shown in FIG. 1 and FIG. 6, the housing has an opening O, formed in an interface I between the first part 10a and the second part 10b. The opening O allows the cable 5 to extend out of the housing along a cable exit direction E. The opening O is also designed and dimensioned such that the walls forming the opening O interacts with the cable 5 such that it secures the cable 5 against movement relative to the housing along the cable exit direction E. It may be noted that in this context securing need not be absolute. It might be possible to pull the cable in the cable exit direction if sufficient force is applied. However, the housing interacts with the cable such that there is a significant force needed to pull the cable thereby providing a cable strain relief function eliminating or at least reducing the risk of forces applied e.g. by the user onto the cable being transmitted to the electric circuitry.

As shown in FIG. 6, the opening O is formed by a first recess 11a in a wall portion 12a of the first part 10a and a second recess 11b in a wall portion 12b of the second part 10b. The first and second recesses 11a, 11b are both open towards the interface I and extends through the respective wall portion 12a, 12b in the cable exit direction E. The two parts 10a, 10b are adapted to be attached to each other such that the lines M in the upper and lower half of FIG. 6 form a single line M. Each recess 11a, 11b has a first sidewall portion 13a, 13b, a bottom portion 14a, 14b and a second sidewall portion 15a, 15b.

Figure 5:
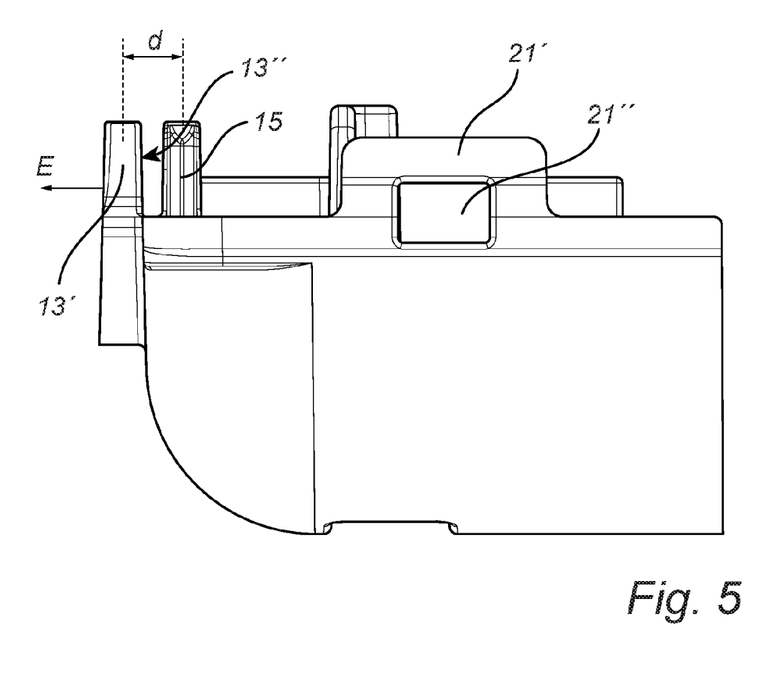

As shown in FIG. 5, the first 13 and second 15 sidewall portions are arranged offset to each other in the cable exit direction E. The offset is indicated by the distance d in FIG. 5.

Figure 7:
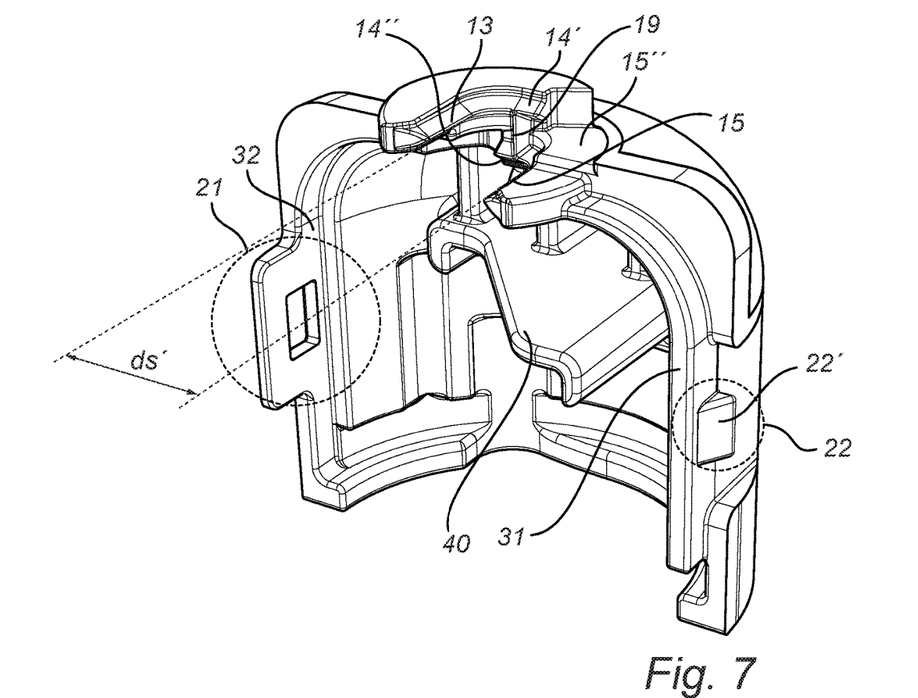

As shown in FIG. 7, the bottom portion 14 is formed of one portion 14' extending as an extension of the first side wall 13 and one portion 14'' extending as an extension of the second side wall 15. Thus, the two portions 14' and 14'' of the bottom will be offset to each other along the exit direction E.

As is shown in FIG. 7, there is also provided a ridge 19 extending along the exit direction E. The ridge 19 is formed as a protrusion extending upwardly in the direction U and extending along the exit direction E between the two bottom portions 14' and 14''. The ridge 19 is adapted to interact with the casing of the cable 5 and thereby prevent the cable 5 from rotating inside the opening O.

When the two parts 10a, 10b are in the connected state, the first sidewall portion 13a of the first recess 11a will be arranged opposite, in a direction T (shown in FIG. 1) perpendicular to the cable exit direction E, the first sidewall portion 13b of the second recess 11b and the second sidewall portion 15a of the first recess 11a is arranged opposite, in a direction T perpendicular to the cable exit direction E, the second sidewall portion 15b of the second recess 11b.

When the camera 1 is assembled the first and second parts 10a, 10b are adapted to house a portion of the cable 5 and the sidewalls 13, 15 of the recesses 11a, 11b are adapted to hold the cable 5 and provide a cable strain relief function.

Figure 8:
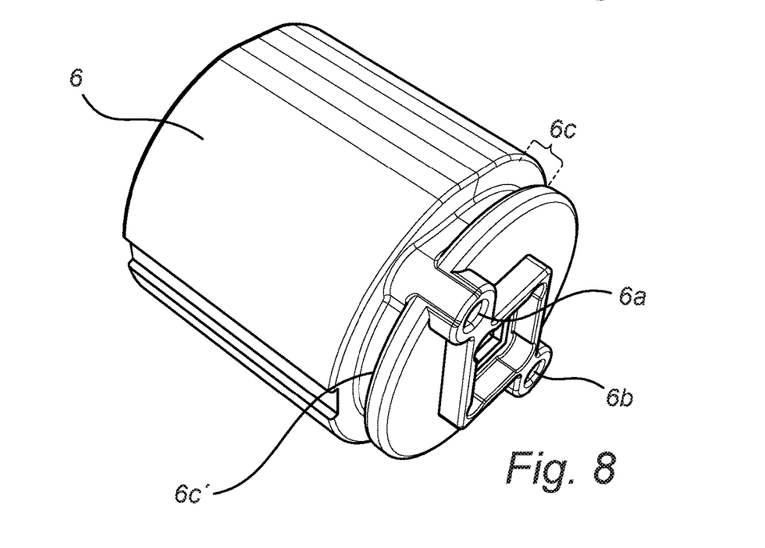
FIG. 8 discloses another member of the housing of the camera.
Figure 9:
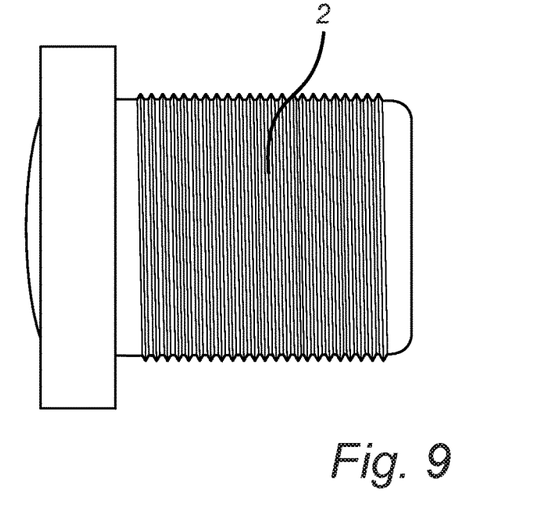
FIG. 9 discloses an optical system.

As shown in FIG. 8, the body member 6 is, in the preferred embodiment, provided with an attachment portion 6c and the first and second parts 10a, 10b are provided with attachment portions 16 adapted to interact with the attachment portion 6c of the body member 6. The attachment portions 16 are formed of a radially inwardly extending shoulder 16' adapted to interact with radially outwardly extending shoulder 6c' of the body member 6. In the shown embodiment, the shoulders are formed of semi-continuous circumferentially extending protrusions and grooves.

As shown in FIG. 6, the first 13a, 13b and second sidewalls 15a, 15b have, along a direction U extending from the respective bottom wall portion 14a, 14b towards the bottom wall portion of the opposing recess 14b, 14a, an extension past a mid-point M of the opening. These sidewalls 13a-b, 15a-b are provided on protrusions 13'a-b, 15'a-b which, along a direction U extending from the respective bottom wall portion 14a, 14b towards the bottom wall portion of the opposing recess 14b, 14a, has an extension past a mid-point M of the opening O. In the preferred embodiment, the protrusions 13', 15' has an extension above the mid-point M being slightly larger than the distance $d_b'$ between the bottom 14 and the mid-point M.

In FIG. 6, half the distance $d_b$ is indicated by the reference $d_b'$. The bottom portion 14 is shaped as a half-circle. The sidewalls 13, 15 are shaped as straight-lines extending upwardly from the bottom portion 14. The transition from the bottom 14 and the sidewalls 13, 15 is tangential. The opening thus formed will be an oblong hole with each end formed as a half-circle and the ends connected with straight lines.

The distance $d_b'$ and the shape of the bottom portion 14 are chosen such that the interaction between the surfaces of the recesses and the external surface of the cable 5 provides a sealing effect.

As shown in FIG. 5 and FIG. 6, the first protrusions 13 of the two parts 10a, 10b have a first surface 13". The surface 13" may be said to be facing inwardly or may be said to face with its normal opposite to the cable exit direction E. The surfaces 13" are each adapted to face or abut a second surface 15" of the other part 10b, 10a. The second surface 15" may be said to be facing outwardly or may be said to face with its normal in the cable exit direction E. The parts 10a, 10b are manufactured with tolerances such that face or abut in this sense may be anything from a small play to a small interference fit, the interference fit being in such a case so small that there is no blocking effect preventing the parts 10a, 10b from being assembled. The surfaces 13" and 15" may be designed such that they are sufficiently close to each other such that they may interact once any force is applied to the system.

The first surfaces 13" are located above the mid-point M of respective part. The second surfaces 15" are located below the mid-point M of respective part. The sidewalls 13, 15 are formed by portions of the recess 11 below the mid-point M and by portions formed by towards each other facing surfaces on the protrusions 13', 15'.

When the first and second parts 10a, 10b are in the connected state, a shortest distance $d_s$ (shown in FIG. 6) between the opposing sidewalls 13, 15 is smaller than a maximum distance $d_b$ between the bottom wall portions 14 of opposing recesses 11a, 11b.

The distance $d_s$ is dimensioned to be smaller than a size (in this case the diameter D) of the cable 5. It may be noted that the distance $d_s$ is the distance between the opposing first sidewalls 13a, 13b of the first and second recesses 11a, 11b or the distance between the opposing second sidewalls 15a, 15b of the first and second recesses 11a, 11b. In this design the distances will be the same, namely the distance $d_s$.

A related distance is the shortest distance $d_s'$ (shown in FIG. 2) between the first 13a and second 15a sidewalls of the first recess 11a and/or the shortest distance $d_s'$ between the first 13b and second 15b sidewalls of the second recess 11b. Since the first and second sidewalls 13, 15 of a given recess are offset to each other, the shortest distance will not be measured strictly orthogonal to the cable exit direction E but will be slightly inclined relative to the cable exit direction E. The distance $d_s'$ will be slightly larger than the distance $d_s$ between the directly opposing first sidewalls 13a, 13b and the directly opposing second sidewalls 15a, 15b.

Figure 2:
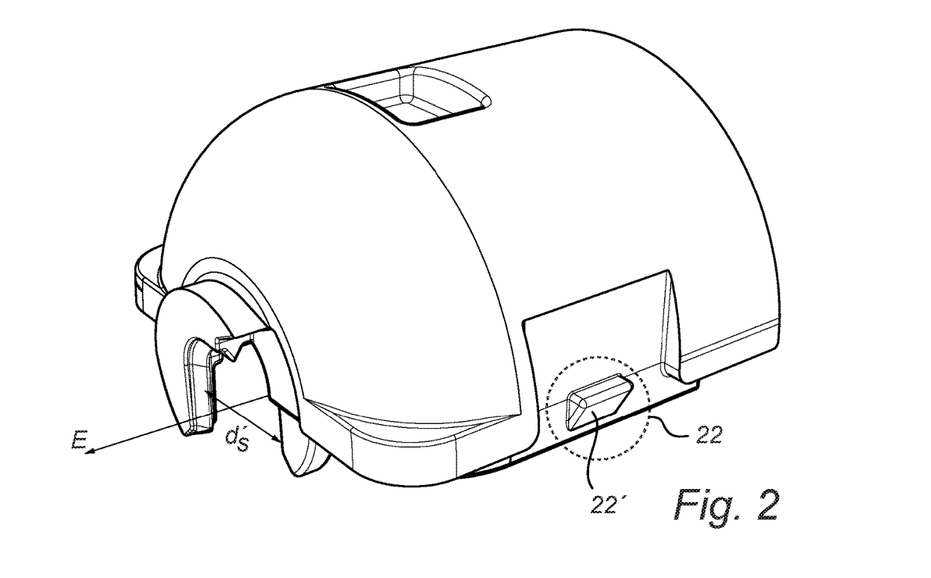
Figure 3:
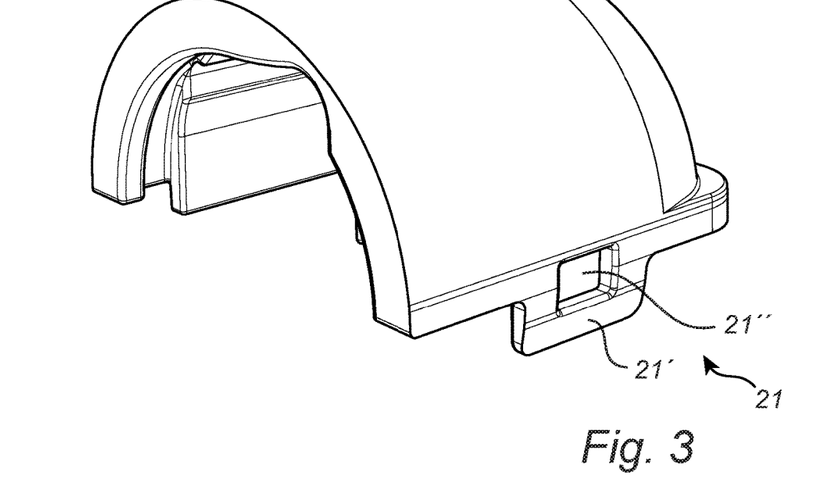

The distance $d_s'$ in relation to the size of the cable 5 will have an influence on the force by which one of the parts 10a, 10b holds the cable before and during assembly.

The shortest distance $d_s$ between directly opposing sidewalls 13a, 13b or 15a, 15b in relation to the size of the cable 5 will have an influence on the force by which the parts together hold the cable when the parts are in the connected state.

Figure 4:
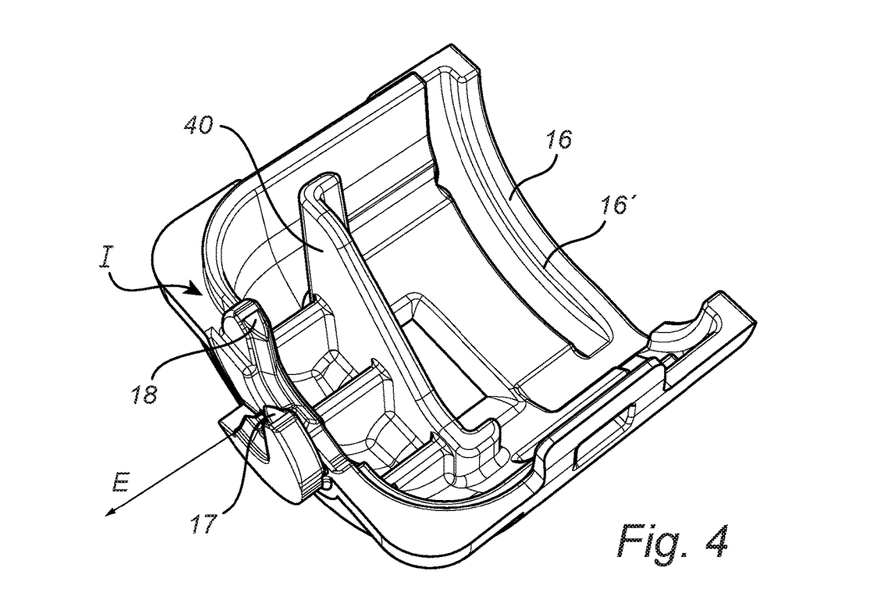

As shown e.g. in FIG. 4, the sidewalls 13, 15 are each provided with a triangular protrusion 17, 18 extending along the sidewalls 13, 15 and thereby present a contact surface providing a line contact. The line contact extends along the first sidewall 13, the bottom portion 14 and the second sidewall 15.

As shown in the figures and noted in FIG. 7, respective part 10a, 10b is provided with a first part 21 of a snap-lock and a second part 22 of a snap-lock. Thus, the two parts 10a, 10b together provides two snap-locks. In general terms this may also be defined as the first part 10a is provided with a first member 21 of a first snap-lock and a second member 22 of a second snap-lock of the same kind as the first snap-lock and the second part 10b is provided with a second member 22 of the first snap-lock and a first member 21 of the second snap-lock. The parts 21, 22 of the snap-lock are provided on opposite sides of the housing and are provided close to an interface between the two parts. The first part 21 is formed of a tongue 21' provided with a hole 21" and is adapted to extend past the nominal interface such that the hole 21" interacts with a tooth 22' of the second part 22. The tooth 22' is located on the outer surface of the other part 10b of the housing. It is preferred that the locks are identical and, as mentioned, in the preferred embodiment the two parts 10a, 10b are identical.

In FIG. 7 it is also shown that respective part 10a, 10b is provided with a guiding flange 31 adapted to coextend with and abut an inside wall portion 32 of the other part 10b, 10a.

In FIG. 7 it is also shown that the part 10 is also provided with a partition wall 40 providing a non-straight cable routing to secure that a minimum length of the cable is located inside the housing. This way it may be secured that the portion 5''' of the cable were the outer casing is removed ends well before cable 5 reaches the opening O.

The housing formed of the two parts 10a, 10b may enclose a length of the cable 5 being larger than the length necessary to connect to the electric circuitry.

It is contemplated that there are numerous modifications of the embodiments described herein, which are still within the scope of the disclosure as defined by the claims.

The protrusions 13', 15' may e.g. have an extension above the mid-point M different from the preferred embodiment. The extension may for instance be 25% or more compared to the distance $d_b'$ between the bottom 14 and the mid-point M. The extension may for instance be 50% or more compared to the distance $d_b'$ between the bottom 14 and the mid-point M.

On the other hand it may be noted that excessive extension of the protrusions 13', 15' past the mid-point M will have limited effect on the cable strain relief function and may have negative impact on the manufacturing and handleability. The extension may for instance be 200% or less compared to the distance $d_b'$ between the bottom 14 and the mid-point M. The extension may for instance be 150% or less compared to the distance $d_b'$ between the bottom 14 and the mid-point M. The extension may for instance be 125% or less compared to the distance $d_b'$ between the bottom 14 and the mid-point M. Thus, the extension of the protrusions 13', 15' past the mid-point M may for instance be 25%-200%, 50%-200%, 25%-150%, 50-150%, 25%-125%, or 50%-125% compared to the distance $d_b'$ between the bottom 14 and the mid-point M. Alternatively the respective lower limit of any of the above intervals may be at a lower level of 20%. Alternatively, the respective lower limit of any of the above intervals may be at a lower level of 15%.

It may be noted that the housing and the cable relief function has been discussed and disclosed in the context of a camera. The disclosure is especially useful for use in this context, but may also be useful for other applications, such as providing a housing 5" to a connector 5'.

The disclosure may in short be said to relate to a housing for enclosing an electric circuitry 4 and for providing a cable strain relief function to a cable 5 extending from the electric circuitry 4 and out of said housing, the housing comprising a first part 10a with a first recess 11a and a second part 10b with a second recess 11b, wherein the first and second recesses 11a, 11b each has a first sidewall portion 13a, a bottom portion 14a and a second sidewall portion 15a, the first and second sidewall portions 13a, 15a of the first recess 11a being arranged offset d to each other in a cable exit direction E, wherein, when the first and second parts 10a, 10b are in the connected state, the first sidewall portion 13a of the first recess 11a is arranged opposite, in a direction T perpendicular to the cable exit direction E, the first sidewall portion 13b of the second recess 11b and the second sidewall portion 15a of the first recess 11a is arranged opposite, in a direction T perpendicular to the cable exit direction E, the second sidewall portion 15b of the second recess 11b.

What is claimed is:

1. A housing for enclosing an electric circuitry and for providing a cable strain relief function to a cable extending from the electric circuitry and out of the housing, the housing comprising:
   a first part and a second part, the first and second parts being separate parts adapted to be connected to each other in a connected state thereby forming the housing;
   the housing having an opening, formed in an interface between the first part and the second part, for allowing the cable to extend out of the housing along a cable exit direction and for securing the cable against movement relative to the housing along the cable exit direction, the opening being formed by a first recess in a wall portion of the first part and a second recess in a wall portion of the second part, the first and second recesses both being open towards the interface and extending through the respective wall portion in the cable exit direction;
   wherein the first recess has a first sidewall portion, a bottom portion and a second sidewall portion;
   wherein the second recess has a first sidewall portion, a bottom portion and a second sidewall portion;
   wherein the first and second sidewall portions of the first recess being arranged offset to each other in the cable exit direction;
   wherein the first and second sidewall portions of the second recess being arranged offset to each other in the cable exit direction;
   wherein, when the first and second parts are in the connected state, the first sidewall portion of the first recess is arranged opposite, in a direction perpendicular to the cable exit direction, the first sidewall portion of the second recess and the second sidewall portion of the first recess is arranged opposite, in a direction perpendicular to the cable exit direction, the second sidewall portion of the second recess;
   wherein the first and second parts are each provided with a first protrusion and a second protrusion each having, along a direction extending from the respective bottom wall portion towards the bottom wall portion of the opposing recess, an extension past a mid-point of the opening;
   wherein the first protrusion of the first part is provided with a first surface adapted face a second surface of the second part;
   wherein the first protrusion of the second part is provided with a first surface adapted to face a second surface of the first part;
   wherein the first surfaces are at least partly located above the mid-point of respective part; and
   wherein the second surfaces are at least partly located below the mid-point of respective part.

2. The housing according to claim 1, wherein the first and second sidewalls of the first and second recess have, along a direction extending from the respective bottom wall portion towards the bottom wall portion of the opposing recess, an extension past a mid-point of the opening.

3. The housing according to claim 1, wherein the offset of the sidewalls of the first part is equal to the offset of the sidewalls of the second part.

4. The housing according to claim 1, wherein, when the first and second parts are in the connected state, a shortest distance between the first sidewalls and/or between the second sidewalls is smaller than a maximum distance between the bottom wall portions of the first and second recesses.

5. The housing according to claim 1, wherein a portion of the first sidewall of respective recess is formed by a surface of the first protrusion facing the second protrusion and a portion of the second sidewall of respective recess is formed by a surface of the second protrusion facing the first protrusion.

6. The housing according to claim 1, wherein the first part is provided with a first member of a snap-lock and the second part is provided with a second member of the snap-lock.

7. The housing according to claim 1, wherein the first part is provided with a first member of a first snap-lock and a second member of a second snap-lock of the same kind as the first snap-lock and the second part is provided with a second member of the first snap-lock and a first member of the second snap-lock.

8. The housing according to claim 1, wherein the bottom portion of respective recess is formed of a first portion extending as an extension of the first side wall portion and a second portion extending as an extension of the second side wall portion;

wherein the two portions are offset to each other along the exit direction;

wherein respective part also comprises a ridge formed as a protrusion extending along a direction, extending from the respective bottom wall portion towards the bottom wall portion of the opposing recess, and extending along the exit direction between the two bottom portions.

9. The housing according to claim 1, wherein the first part is provided with a guiding flange adapted to coextend with and abut an inside wall portion of the second part and wherein the second part is provided with a guiding flange adapted to coextend with and abut an inside wall portion of the first part.

10. The housing according to claim 1, wherein the first part and the second part are identical.

11. A camera comprising an optical system, an image sensor, electric circuitry connected to the image sensor, a cable connected to and extending from the electric circuitry, and a body member housing or supporting the optical system, the image sensor and the electric circuitry;

the camera further comprising a housing together with the body member enclosing the electric circuitry and providing a cable strain relief function to the cable extending from the electric circuitry and out of the housing;

the housing comprising a first part and a second part, the first and second parts being separate parts adapted to be connected to each other in a connected state thereby forming the housing;

the housing having an opening, formed in an interface between the first part and the second part, for allowing the cable to extend out of the housing along a cable exit direction and for securing the cable against movement relative to the housing along the cable exit direction, the opening being formed by a first recess in a wall portion of the first part and a second recess in a wall portion of the second part, the first and second recesses both being open towards the interface and extending through the respective wall portion in the cable exit direction;

wherein the first recess has a first sidewall portion, a bottom portion and a second sidewall portion;

wherein the second recess has a first sidewall portion, a bottom portion and a second sidewall portion;

wherein the first and second sidewall portions of the first recess being arranged offset to each other in the cable exit direction;

wherein the first and second sidewall portions of the second recess being arranged offset to each other in the cable exit direction;

wherein, when the first and second parts are in the connected state, the first sidewall portion of the first recess is arranged opposite, in a direction perpendicular to the cable exit direction, the first sidewall portion of the second recess and the second sidewall portion of the first recess is arranged opposite, in a direction perpendicular to the cable exit direction, the second sidewall portion of the second recess;

wherein the first and second parts are each provided with a first protrusion and a second protrusion each having, along a direction extending from the respective bottom wall portion towards the bottom wall portion of the opposing recess, an extension past a mid-point of the opening;

wherein the first protrusion of the first part is provided with a first surface adapted face a second surface of the second part;

wherein the first protrusion of the second part is provided with a first surface adapted to face a second surface of the first part;

wherein the first surfaces are at least partly located above the mid-point of respective part;

wherein the second surfaces are at least partly located below the mid-point of respective part;

wherein the body member is provided with an attachment portion;

wherein the first and second parts of the housing are provided with attachment portions adapted to interact with the attachment portion of the body member; and wherein the housing is adapted to house a portion of the cable and wherein the sidewalls of the recesses are adapted to hold the cable and provide a cable strain relief function.

12. The camera according to claim 11, wherein, when the first and second parts are in the connected state, a shortest distance between the first sidewalls and/or between the second sidewalls is dimensioned to be smaller than a size of the cable located between the first and/or second sidewalls.

13. The camera according to claim 11, wherein a shortest distance between the first and second sidewalls of the first and/or second recess is dimensioned to be smaller than a size of the cable located between the first and second sidewalls.

14. A housing for enclosing an electric circuitry and for providing a cable strain relief function to a cable extending from the electric circuitry and out of the housing, the housing comprising:

a first part and a second part, the first and second parts being separate parts adapted to be connected to each other in a connected state thereby forming the housing;

the housing having an opening, formed in an interface between the first part and the second part, for allowing the cable to extend out of the housing along a cable exit direction and for securing the cable against movement relative to the housing along the cable exit direction, the opening being formed by a first recess in a wall portion of the first part and a second recess in a wall portion of the second part, the first and second recesses both being open towards the interface and extending through the respective wall portion in the cable exit direction;

wherein the first recess has a first sidewall portion, a bottom portion and a second sidewall portion;

wherein the second recess has a first sidewall portion, a bottom portion and a second sidewall portion;

wherein the first and second sidewall portions of the first recess being arranged offset to each other in the cable exit direction;

wherein the first and second sidewall portions of the second recess being arranged offset to each other in the cable exit direction;

wherein, when the first and second parts are in the connected state, the first sidewall portion of the first recess is arranged opposite, in a direction perpendicular to the cable exit direction, the first sidewall portion of the second recess and the second sidewall portion of the first recess is arranged opposite, in a direction perpendicular to the cable exit direction, the second sidewall portion of the second recess; and wherein, when the first and second parts are in the connected state, a shortest distance between the first sidewalls and/or between the second sidewalls is smaller than a maximum distance between the bottom wall portions of the first and second recesses.

\* \* \* \* \*

UNITED STATES PATENT AND TRADEMARK OFFICE
CERTIFICATE OF CORRECTION

PATENT NO. : 9,967,440 B2
APPLICATION NO. : 15/163872
DATED : May 8, 2018
INVENTOR(S) : Stefan Larsson Page 1 of 1

It is certified that error appears in the above-identified patent and that said Letters Patent is hereby corrected as shown below:

In the Claims

In Claim 1, at Column 10, Line 27, after the word "adapted", insert therefor --to--.

In Claim 11, at Column 12, Line 2, after the word "adapted", insert therefor --to--.

Signed and Sealed this
Twenty-sixth Day of February, 2019

Andrei Iancu
*Director of the United States Patent and Trademark Office*